(12) United States Patent
Liang et al.

(10) Patent No.: US 8,653,504 B2
(45) Date of Patent: Feb. 18, 2014

(54) COMPLEMENTARY TUNNELING FIELD EFFECT TRANSISTOR AND METHOD FOR FORMING THE SAME

(75) Inventors: Renrong Liang, Beijing (CN); Jun Xu, Beijing (CN); Jing Wang, Beijing (CN)

(73) Assignee: Tsinghua University (CN)

( * ) Notice: Subject to any disclaimer, the term of this patent is extended or adjusted under 35 U.S.C. 154(b) by 0 days.

(21) Appl. No.: 13/386,581

(22) PCT Filed: Nov. 28, 2011

(86) PCT No.: PCT/CN2011/083069
§ 371 (c)(1),
(2), (4) Date: Jan. 23, 2012

(87) PCT Pub. No.: WO2012/136066
PCT Pub. Date: Oct. 11, 2012

(65) Prior Publication Data
US 2012/0267609 A1    Oct. 25, 2012

(30) Foreign Application Priority Data

Apr. 7, 2011    (CN) .......................... 2011 1 0086616

(51) Int. Cl.
*H01L 29/06* (2006.01)
*H01L 29/08* (2006.01)
*H01L 21/8238* (2006.01)

(52) U.S. Cl.
USPC .............. 257/39; 257/E27.061; 257/E21.629; 438/212

(58) Field of Classification Search
USPC ........................................... 257/39; 438/212
See application file for complete search history.

(56) References Cited

U.S. PATENT DOCUMENTS

| 7,560,358 B1* | 7/2009 | Kim et al. ...................... 438/424 |
| 8,410,538 B2* | 4/2013 | Ishiduki et al. ............... 257/319 |
| 2008/0224224 A1* | 9/2008 | Vandenderghe et al. ..... 257/365 |

(Continued)

FOREIGN PATENT DOCUMENTS

| CN | 101771050 A | 7/2010 |
| CN | 102184955 A | 9/2011 |

OTHER PUBLICATIONS

International Search Report for Application No. PCT/CN2011/083069 date Mar. 8, 2012.

(Continued)

*Primary Examiner* — Matthew Landau
*Assistant Examiner* — Igwe U Anya
(74) *Attorney, Agent, or Firm* — Lerner, David, Littenberg, Krumholz & Mentlik, LLP

(57) ABSTRACT

A complementary tunneling field effect transistor and a method for forming the same are provided. The complementary tunneling field effect transistor comprises: a substrate; an insulating layer, formed on the substrate; a first semiconductor layer, formed on the insulating layer and comprising first and second doped regions; a first type TFET vertical structure formed on a first part of the first doped region and a second type TFET vertical structure formed on a first part of the second doped region, in which a second part of the first doped region is connected with a second part of the second doped region and a connecting portion between the second part of the first doped region and the second part of the second doped region is used as a drain output; and a U-shaped gate structure, formed between the first type TFET vertical structure and the second type TFET vertical structure.

18 Claims, 15 Drawing Sheets

(56) References Cited

U.S. PATENT DOCUMENTS

| | | | |
|---|---|---|---|
| 2009/0026491 A1* | 1/2009 | Booth et al. | 257/105 |
| 2009/0072270 A1* | 3/2009 | Asbeck et al. | 257/190 |
| 2009/0236657 A1 | 9/2009 | Ananthan | |
| 2010/0025766 A1* | 2/2010 | Nuttinck et al. | 257/351 |
| 2011/0253981 A1* | 10/2011 | Rooyackers et al. | 257/24 |
| 2012/0199814 A1* | 8/2012 | Berger | 257/24 |
| 2012/0223387 A1* | 9/2012 | Cui et al. | 257/366 |
| 2012/0261744 A1* | 10/2012 | Wang et al. | 257/329 |

OTHER PUBLICATIONS

Krishna Kumar et al., Vertical Tunnel Field-Effect Transistor, IEEE Transactions on Electron Devices, Feb. 2004, vol. 51, No. 2, pp. 279-282.

* cited by examiner

COMPLEMENTARY TUNNELING FIELD EFFECT TRANSISTOR AND METHOD FOR FORMING THE SAME

CROSS-REFERENCE TO RELATED APPLICATIONS

The present application is a national phase entry under 35 U.S.C. §371 of International Application No. PCT/CN2011/083069 filed on Nov. 28, 2011, which claims priority from Chinese Patent Application No. 201110086616.1 filed on Apr. 7, 2011, all of which are hereby incorporated herein by reference.

FIELD OF THE INVENTION

The present disclosure relates to semiconductor manufacture and design, and more particularly to a complementary tunneling field effect transistor with a U-shaped gate structure and a method for forming the same.

BACKGROUND OF THE INVENTION

For a long time, in order to achieve a higher chip density, a faster operating speed and a lower power consumption, a feature size of a metal-oxide-semiconductor field effect transistor (MOSFET) is continuously scaled down, and currently has reached an ultra deep submicron level and a nanometer level. However, a serious challenge is an emergence of a short-channel effect, such as a subthreshold voltage roll-off (Vt roll-off), a drain-induced barrier lowering (DIBL) and a source-drain punch through, thus increasing a subthreshold slope of the MOSFET and significantly increasing an off-state leakage current. Therefore, a performance of the MOSFET may be deteriorated.

A TFET (tunneling field effect transistor) is a quantum mechanical device based on a tunneling effect of a carrier, and has a weaker short-channel effect and a smaller leakage current compared with a conventional MOS transistor. The structure of a TFET device is based on a metal-oxide-semiconductor gated P-I-N diode. FIG. 1 is a cross-sectional view of a conventional TFET with an N-type channel. Particularly, the conventional TFET comprises: a substrate 1100'; an insulating layer 1200' formed on the substrate 1100'; a P-doped source region 1000', an N-doped drain region 2000' and a channel region 3000' between the P-doped source region 1000' and the N-doped drain region 2000' formed on the insulating layer 1200'; and a gate stack 4000' formed on the channel region 3000'. The channel region 3000' may be intrinsically doped, lightly P-doped or lightly N-doped. Preferably, the channel region 3000' is lightly N-doped. That is, the N-type TFET preferably has a P$^+$/N$^-$/N$^+$ structure. The gate stack 4000' comprises a gate dielectric layer formed on the channel region 3000' and a gate conductive layer formed on the gate dielectric layer.

When the TFET is turned off, that is, no gate voltage is applied, a junction formed between the source region 1000' and the drain region 2000' is a reverse biased diode, and a potential barrier created by the reverse biased diode is greater than that created by a conventional complementary MOSFET, thus greatly reducing a subthreshold leakage current and a direct tunneling current of the TFET even if a channel length is very short. When a voltage is applied to a gate in the TFET, under an action of a field effect, an electron channel may be formed in the channel region 3000'. Once an electron concentration in the channel region 3000' is degenerated, a tunneling junction will be formed between the source region 1000' and the channel region 3000', and a tunneling current generated by carrier tunneling will pass through the tunneling junction. From the perspective of an energy band, with the tunneling field effect transistor based on a gate controlled P-I-N diode, a tunnel length of a PN junction formed between the source region 1000' and the channel region 3000' is adjusted by controlling the voltage of the gate. Therefore, the tunneling field effect transistor is a transistor with a very low leakage current. As a result, when the tunneling field effect transistor works, a voltage of a power supply may be reduced to 0.5 volts or even 0.1 volts, and consequently the tunneling field effect transistor may be applied to a circuit chip with a low power consumption. However, because of being limited by a band-to-band tunneling probability, a driving current of a conventional tunneling field effect transistor is lower than that of a conventional MOSFET device by 2 to 4 orders of magnitude. Therefore, in order to improve a performance of an integrated circuit chip integrated with a tunneling field effect transistor, the driving current of the tunneling field effect transistor needs to be increased, and the subthreshold slope needs to be reduced. Currently, there are two following problems to be solved. On the one hand, in order to reduce the subthreshold slope, a doping concentration gradient of the PN junction formed between the source region and the channel region needs to be more steep, however, the conventional tunneling field effect transistor with a planar structure may not meet this requirement, thus largely increasing a difficulty of process flows and a cost. On the other hand, when the driving current of the tunneling field effect transistor is increased using narrow band-gap materials, the off-state leakage current of the device will be increased, thus deteriorating the performance of the transistor.

BRIEF SUMMARY OF THE INVENTION

The present disclosure is aimed to solve at least one of the above mentioned technical problems.

According to an aspect of the present disclosure, a complementary tunneling field effect transistor is provided, comprising: a substrate; an insulating layer, formed on the substrate; a first semiconductor layer, formed on the insulating layer and comprising a first doped region and a second doped region; a first type TFET vertical structure formed on a first part of the first doped region and a second type TFET vertical structure formed on a first part of the second doped region, in which a second part of the first doped region is connected with a second part of the second doped region and a connecting portion between the second part of the first doped region and the second part of the second doped region is used as a drain output; and a U-shaped gate structure, formed between the first type TFET vertical structure and the second type TFET vertical structure.

In one embodiment, the first type TFET vertical structure is an N-type TFET vertical structure, the second type TFET vertical structure is a P-type TFET vertical structure, the first doped region is an N-doped region, and the second doped region is a P-doped region.

In one embodiment, the first type TFET vertical structure comprises a second semiconductor layer formed on the first part of the first doped region, a third semiconductor layer formed on the second semiconductor layer, and a source region formed on the third semiconductor layer; and the second type TFET vertical structure comprises a second semiconductor layer formed on the first part of the second doped region, a third semiconductor layer formed on the second semiconductor layer, and a source region formed on the third semiconductor layer.

In one embodiment, each of the first semiconductor layer, the second semiconductor layer on the first part of the first doped region and the second semiconductor layer on the first part of the second doped region is a Si layer, a SiGe layer or a Ge layer.

In one embodiment, each of the first doped region and the second semiconductor layer on the first part of the first doped region is an N-doped region, and the second semiconductor layer on the first part of the second doped region is a P-doped region.

In one embodiment, the source region in the N-type TFET vertical structure is a SiGe or Ge region, and the source region in the P-type TFET vertical structure is a $Si_{1-x}C_x$ alloy region, wherein x ranges from 0.1% to 7.5%.

In one embodiment, the source region in the N-type TFET vertical structure is grounded; the source region in the P-type TFET vertical structure is connected with a power supply; and a gate in the U-shaped gate structure is used as a common gate of the N-type TFET vertical structure and the P-type TFET vertical structure, and the common gate is used as a gate input.

In one embodiment, the U-shaped gate structure comprises: a U-shaped gate dielectric layer; a U-shaped metal gate electrode layer formed on the U-shaped gate dielectric layer; and a polysilicon layer formed on the U-shaped metal gate electrode layer.

According to another aspect of the present disclosure, a method for forming a complementary tunneling field effect transistor is provided, comprising steps of: providing a substrate; forming an insulating layer on the substrate; forming a semiconductor layer on the insulating layer and doping the semiconductor layer to form a first doped region and a second doped region; forming a third semiconductor layer on the semiconductor layer; etching a part of the third semiconductor layer and a part of the semiconductor layer to form a hollow U-shaped concave; forming a U-shaped gate structure in the U-shaped concave; forming a first type TFET vertical structure and a second type TFET vertical structure on two sides of the U-shaped gate structure respectively; etching the semiconductor layer to expose a second part of the first doped region and a second part of the second doped region, in which the second part of the first doped region and the second part of the second doped region are under a bottom of the U-shaped concave, the second part of the first doped region is connected with the second part of the second doped region and a connecting portion between the second part of the first doped region and the second part of the second doped region is used as a drain output of the complementary tunneling field effect transistor.

In one embodiment, the first type TFET vertical structure is an N-type TFET vertical structure, the second type TFET vertical structure is a P-type TFET vertical structure, the first doped region is an N-doped region, and the second doped region is a P-doped region.

In one embodiment, etching the semiconductor layer comprises dividing the semiconductor layer into a first semiconductor layer, a second semiconductor layer on the first doped region, and a second semiconductor layer on the second doped region.

In one embodiment, the first type TFET vertical structure comprises a second semiconductor layer formed on a first part of the first doped region, a third semiconductor layer formed on the second semiconductor layer, and a source region formed on the third semiconductor layer; and the second type TFET vertical structure comprises a second semiconductor layer formed on a first part of the second doped region, a third semiconductor layer formed on the second semiconductor layer, and a source region formed on the third semiconductor layer.

In one embodiment, the first doped region is an N-doped region, and the second doped region is a P-doped region.

In one embodiment, forming the source region in the N-type TFET vertical structure comprises: etching the source region in the N-type TFET vertical structure to form a source region concave; and forming a SiGe or Ge source region in the source region concave.

In one embodiment, forming the source region in P-type TFET vertical structure comprises: etching the source region in the P-type TFET vertical structure to form a source region concave; and forming a $Si_{1-x}C_x$ alloy source region in the source region concave, wherein x ranges from 0.1% to 7.5%.

In one embodiment, the method for forming the complementary tunneling field effect transistor further comprises: forming an interlayer dielectric layer on the U-shaped gate structure, the first type TFET vertical structure, the second type TFET vertical structure, the exposed second part of the first doped region and the exposed second part of the second doped region respectively; and etching the interlayer dielectric layer and forming connecting lines of the U-shaped gate structure, the source region in the first type TFET vertical structure and the source region in the second type TFET vertical structure, and a connecting line of the drain output.

In one embodiment, the source region in the N-type TFET vertical structure is grounded; the source region in the P-type TFET vertical structure is connected with a power supply; and a gate in the U-shaped gate structure is used as a common gate of the N-type TFET vertical structure and the P-type TFET vertical structure, and the common gate is used as a gate input.

In one embodiment, the U-shaped gate structure comprises: a U-shaped gate dielectric layer; a U-shaped metal gate electrode layer formed on the U-shaped gate dielectric layer; and a polysilicon layer formed on the U-shaped metal gate electrode layer.

The complementary tunneling field effect transistor has a U-shaped gate structure, the NTFET and the PTFET are formed on two sides of the U-shaped gate structure respectively, and the gate in the U-shaped gate structure is used as the common gate of the N-type TFET vertical structure and the P-type TFET vertical structure, thus significantly improving an integration degree of the transistor and inhibiting a leakage current. Meanwhile, because the source region is of a semiconductor material with a narrow bandgap (relative to a wide bandgap of a semiconductor in a channel region), the source region may be formed by an epitaxy with an in-situ doping or a deposition, so that a concentration gradient of a PN junction formed between the source region and a channel region may be very steep. Therefore, a driving current may be increased, a subthreshold slope may be further reduced, and a power consumption may be reduced. The complementary tunneling field effect transistor with a U-shaped gate structure according to an embodiment of the present disclosure has high integration degree, large driving current, low power consumption, low leakage current, and so on.

Additional aspects and advantages of the embodiments of the present disclosure will be given in part in the following descriptions, become apparent in part from the following descriptions, or be learned from the practice of the embodiments of the present disclosure.

BRIEF DESCRIPTION OF THE DRAWINGS

These and other aspects and advantages of the disclosure will become apparent and more readily appreciated from the following descriptions taken in conjunction with the drawings in which.

DETAILED DESCRIPTION

Figure 1:
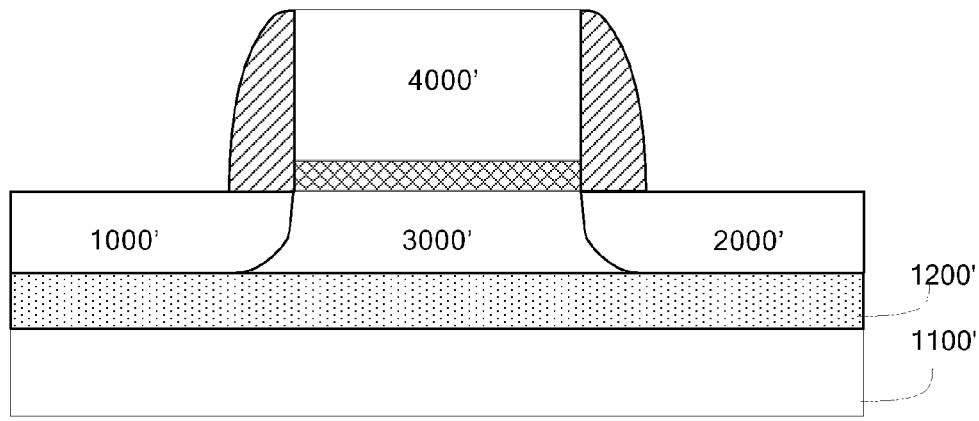
FIG. 1 is a cross-sectional view of a conventional TFET with an N-type channel.

Embodiments of the present disclosure will be described in detail in the following descriptions, examples of which are shown in the accompanying drawings, in which the same or similar elements and elements having same or similar functions are denoted by like reference numerals throughout the descriptions. The embodiments described herein with reference to the accompanying drawings are explanatory and illustrative, which are used to generally understand the present disclosure. The embodiments shall not be construed to limit the present disclosure.

Various embodiments and examples are provided in the following description to implement different structures of the present disclosure. In order to simplify the present disclosure, certain elements and settings will be described. However, these elements and settings are only examples and are not intended to limit the present disclosure. In addition, reference numerals may be repeated in different examples in the disclosure. This repeating is for the purpose of simplification and clarity and does not refer to relations between different embodiments and/or settings. Furthermore, examples of different processes and materials are provided in the present disclosure. However, it would be appreciated by those skilled in the art that other processes and/or materials may be also applied. Moreover, a structure in which a first feature is "on" a second feature may include an embodiment in which the first feature directly contacts the second feature and may include an embodiment in which an additional feature is prepared between the first feature and the second feature so that the first feature does not directly contact the second feature.

FIG. 1 is a cross-sectional view of a conventional TFET with an N-type channel. An insulating layer 1200' is formed on a substrate 1100'; a source region 1000', a drain region 2000', and a channel region 3000' between the source region 1000' and the drain region 2000' are formed on the insulating layer 1200'; and a gate stack 4000' is formed on the channel region 3000'.

Figure 2:
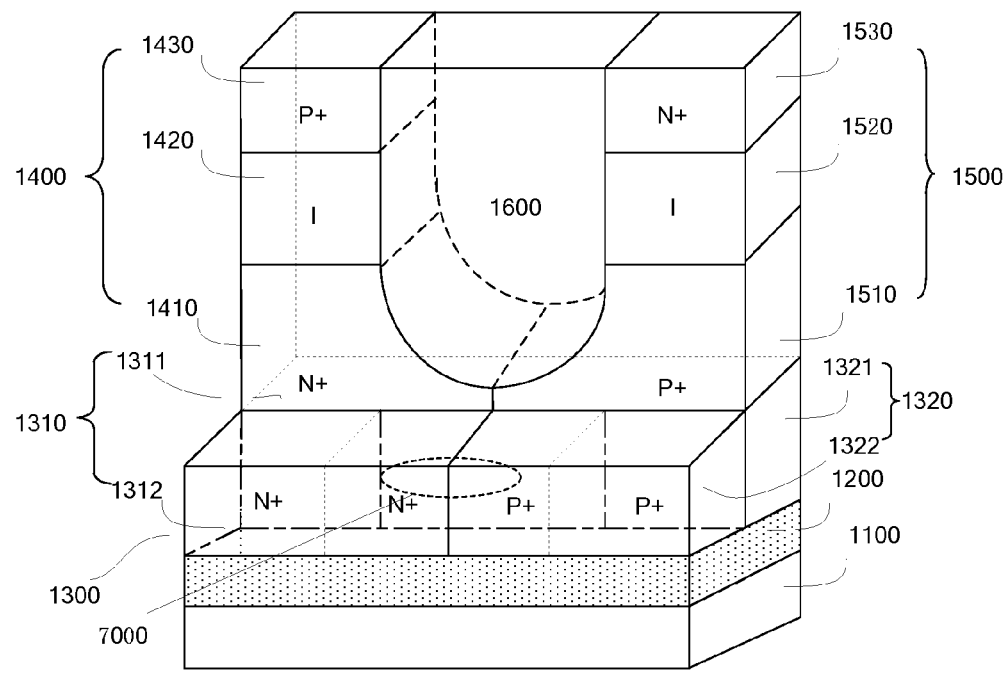
FIG. 2 is a perspective view of a complementary tunneling field effect transistor according to an embodiment of the present disclosure.

FIG. 2 is a perspective view of a complementary tunneling field effect transistor according to an embodiment of the present disclosure. The complementary tunneling field effect transistor comprises: a substrate 1100; an insulating layer 1200 formed on the substrate 1100; a first semiconductor layer 1300 formed on the insulating layer 1200. The first semiconductor layer 1300 comprises a first doped region 1310 and a second doped region 1320. In one embodiment, the first doped region 1310 comprises a first part 1311 and a second part 1312, and the second doped region 1320 comprises a first part 1321 and a second part 1322. The complementary tunneling field effect transistor further comprises: a first type TFET vertical structure 1400 formed on the first part 1311 of the first doped region 1310 and a second type TFET vertical structure 1500 formed on the first part 1321 of the second doped region 1320; and a U-shaped gate structure 1600 formed between the first type TFET vertical structure 1400 and the second type TFET vertical structure 1500. In one embodiment, particularly, the first type TFET vertical structure 1400 comprises: a second semiconductor layer 1410 formed on the first part 1311 of the first doped region 1310, a third semiconductor layer 1420 formed on the second semiconductor layer 1410, and a source region 1430 formed on the third semiconductor layer 1420; and the second type TFET vertical structure 1500 comprises: a second semiconductor layer 1510 formed on the first part 1321 of the second doped region 1320, a third semiconductor layer 1520 formed on the second semiconductor layer 1510, and a source region 1530 formed on the third semiconductor layer 1520. In one embodiment, the substrate 1100 may be a Si substrate, and the insulating layer 1200 may be a $SiO_2$ layer. In one embodiment, the first semiconductor layer 1300, the second semiconductor layer 1410 and the second semiconductor layer 1510 may be layers of identical materials, for example, Si, SiGe or Ge. Moreover, a doping type of the first doped region 1310 in the first semiconductor layer 1300 is identical with that of the second semiconductor layer 1410, and a doping type of the second doped region 1320 in the first semiconductor layer 1300 is identical with that of the second semiconductor layer 1510. The second part 1312 of the first doped region 1310 is connected with the second part 1322 of the second doped region 1320, and a connecting portion between the second part 1312 of the first doped region 1310 and the second part 1322 of the second doped region 1320 is used as a drain output 7000 of the complementary tunneling field effect transistor.

Referring to FIG. 2 again, particularly, in some embodiments, the first type TFET vertical structure 1400 is an N-type TFET vertical structure; the second type TFET vertical structure 1500 is a P-type TFET vertical structure; each of the first doped region 1310, the second semiconductor layer 1410 and the source region 1530 is an N-doped region ($N^+$); and each of the second doped region 1320, the second semiconductor layer 1510 and the source region 1430 is a P-doped region ($P^+$).

Figure 3:
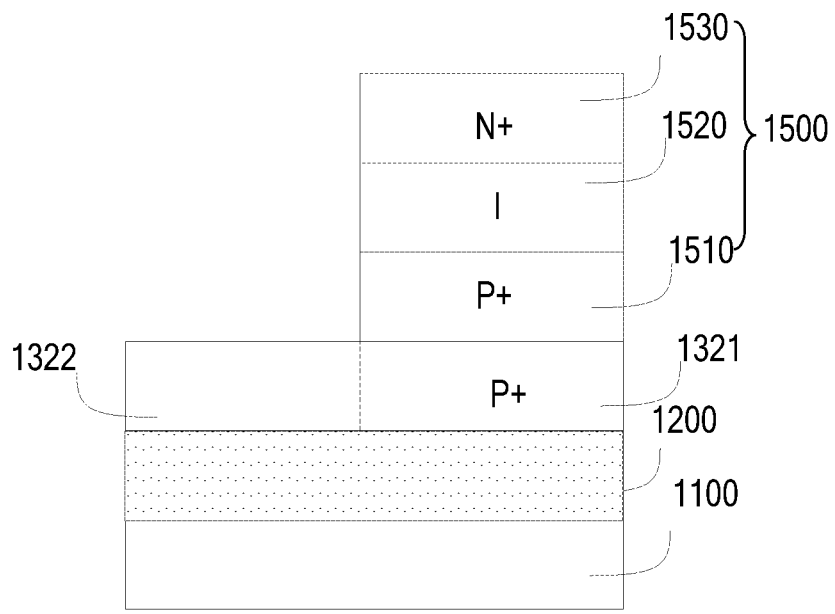
FIG. 3 is a right view of the complementary tunneling field effect transistor in FIG. 2.
Figure 4:
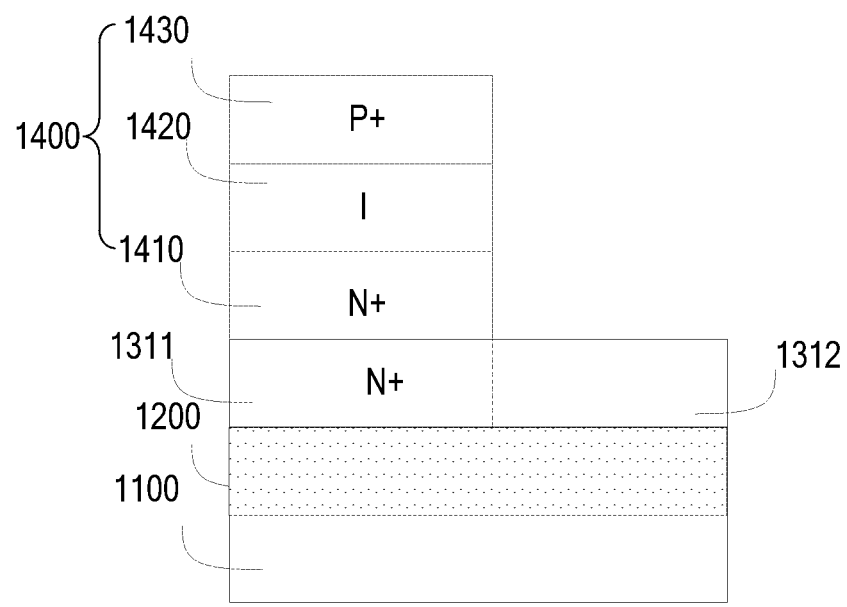
FIG. 4 is a left view of the complementary tunneling field effect transistor in FIG. 2.

FIG. 3 is a right view of the complementary tunneling field effect transistor in FIG. 2. As shown in FIG. 3, the second type TFET vertical structure 1500 is formed on the first part 1321 of the second doped region 1320. FIG. 4 is a left view of the complementary tunneling field effect transistor in FIG. 2. As shown in FIG. 4, the first type TFET vertical structure 1400 is formed on the first part 1311 of the first doped region 1310.

Figure 5:
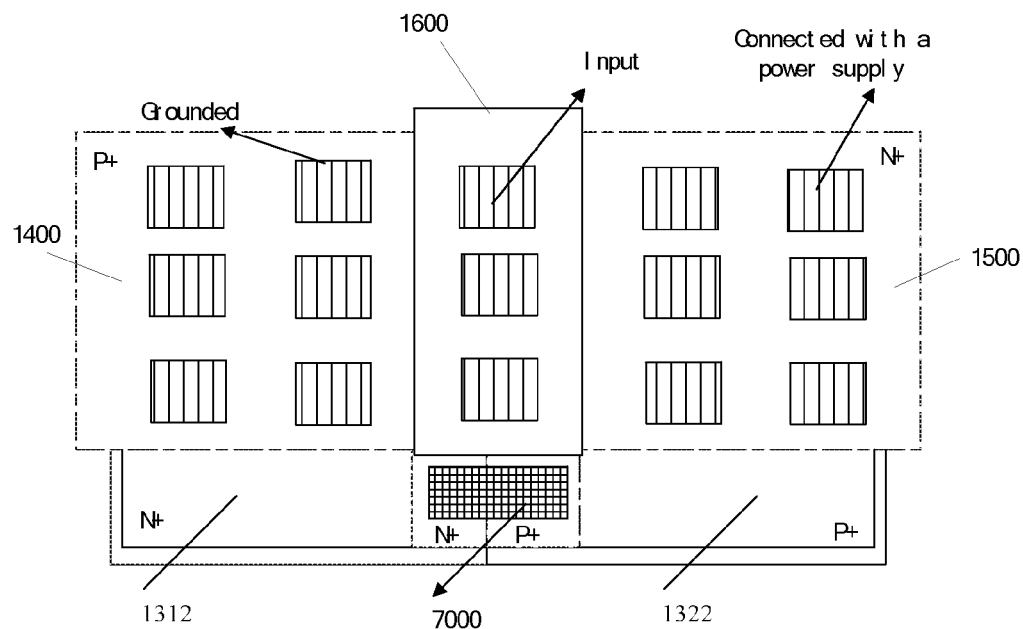
FIG. 5 is a top view of a complementary tunneling field effect transistor according to an embodiment of the present disclosure.
Figure 6:
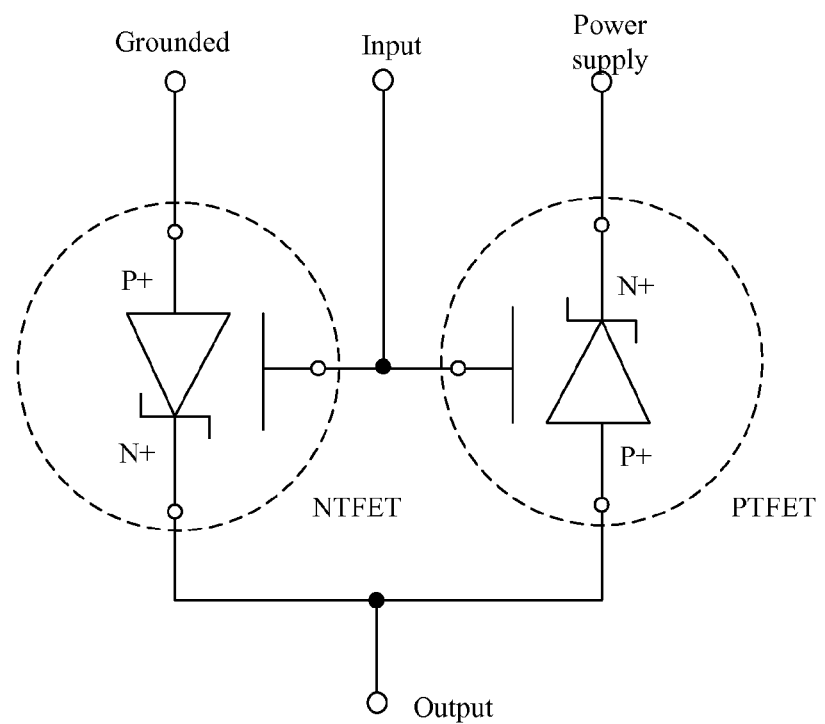
FIG. 6 is an equivalent circuit diagram of a complementary tunneling field effect transistor according to an embodiment of the present disclosure.

FIG. 5 is a top view of a complementary tunneling field effect transistor according to an embodiment of the present disclosure. The U-shaped gate structure 1600 is used as an input; the second part 1312 of the first doped region 1310 is connected with the second part 1322 of the second doped region 1320, and the connecting portion between the second part 1312 of the first doped region 1310 and the second part 1322 of the second doped region 1320 is used as the drain output 7000 of the complementary tunneling field effect transistor; the source region 1430 (P⁺) in the N-type TFET vertical structure 1400 is grounded; and the source region 1530 (N⁺) in the P-type TFET vertical structure 1500 is connected with a power supply. FIG. 6 is an equivalent circuit diagram of a complementary tunneling field effect transistor according to an embodiment of the present disclosure.

In one embodiment, the source region 1430 (P⁺) in the N-type TFET vertical structure 1400 may be a SiGe or Ge region, and the source region 1530 (N⁺) in the P-type TFET vertical structure 1500 may be a $Si_{1-x}C_x$ alloy region, in which x ranges from 0.1% to 7.5%. The source region 1430 and the source region 1530 may be formed using an in-situ doping technique such as a chemical vapor deposition (CVD) or a molecular beam epitaxy (MBE). Therefore, not only a doping concentrate of the source region may be up to $10^{21}$ cm$^{-3}$ orders of magnitude, but also a concentration gradient of a PN junction formed between the source region and a channel region may be very steep, thus significantly improving a device performance.

Figure 7:
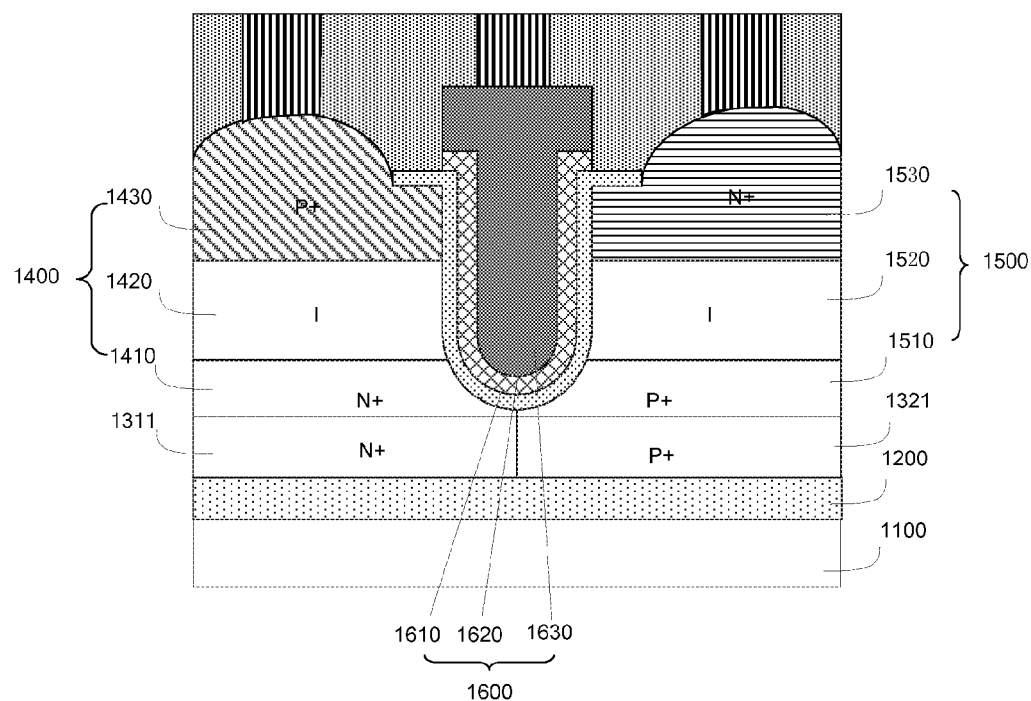
FIG. 7 is a cross-sectional view of a complementary tunneling field effect transistor with a U-shaped gate structure according to an embodiment of the present disclosure.

FIG. 7 is a cross-sectional view of a complementary tunneling field effect transistor with a U-shaped gate structure according to an embodiment of the present disclosure. The U-shaped gate structure 1600 comprises: a U-shaped gate dielectric layer 1610; a U-shaped metal gate electrode layer 1620 formed on the U-shaped gate dielectric layer 1610; and a polysilicon layer 1630 formed on the U-shaped metal gate electrode layer 1620.

FIGS. 8-23 are cross-sectional diagrams of intermediate statuses of a complementary tunneling field effect transistor formed during a process of a method for forming the complementary tunneling field effect transistor according to an embodiment of the present disclosure. The method comprises the following steps.

Step S101, a substrate 1100 is provided. The substrate 1100 may be, for example, a Si substrate.

Step S102, an insulating layer 1200 is formed on the substrate 1100.

Figure 8:
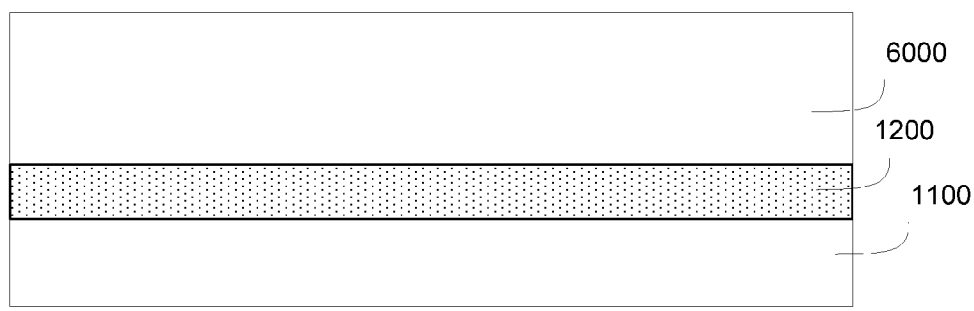
FIGS. 8-23 are cross-sectional diagrams of intermediate statuses of a complementary tunneling field effect transistor formed during a process of a method for forming the complementary tunneling field effect transistor according to an embodiment of the present disclosure.

Step S103, a semiconductor layer 6000 is formed on the insulating layer 1200, as shown in FIG. 8. The semiconductor layer 6000 may be a Si layer, a SiGe layer, a Ge layer, or a Group III-V compound semiconductor layer, for example.

Figure 9:
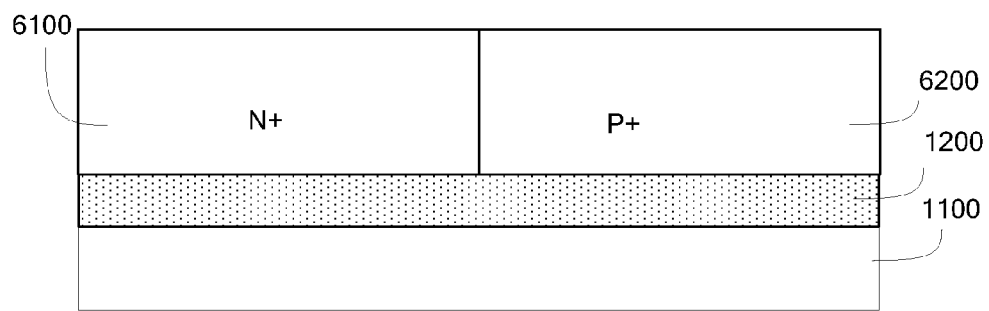

Step S104, the semiconductor layer 6000 is heavily doped to form a first doped region 6100 (N⁺) and a second doped region 6200 (P⁺), as shown in FIG. 9.

Figure 10:
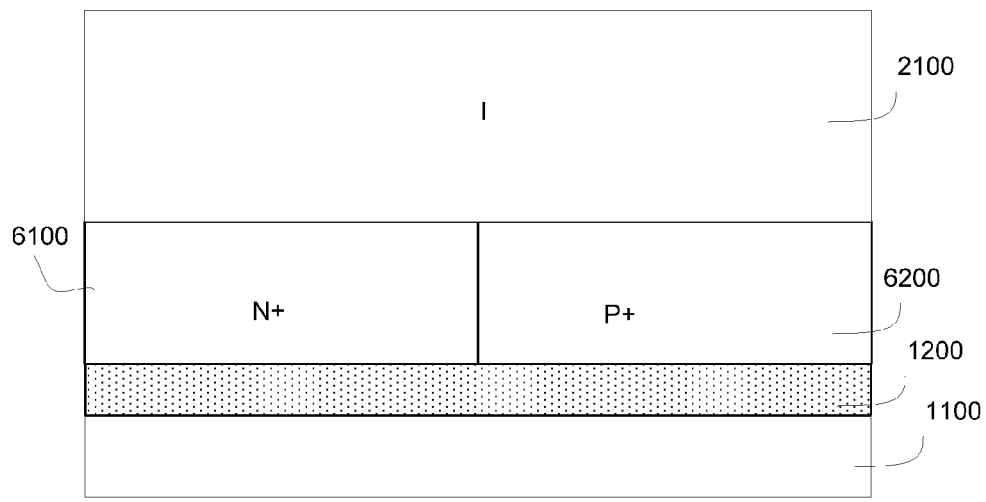

Step S105, a fourth semiconductor layer 2100 is formed on the first doped region 6100 (N⁺) and the second doped region 6200 (P⁺). The fourth semiconductor layer 2100 is, for example, a Si layer, a SiGe layer, a Ge layer, or a Group III-V compound semiconductor layer. The fourth semiconductor layer 2100 is used as an I layer of a channel region in a TFET transistor since its structure is based on a MOS gated reverse-biased P-I-N diode. The I layer may be a lightly N-doped semiconductor layer, a lightly P-doped semiconductor layer, or even an intrinsic semiconductor layer, as shown in FIG. 10.

Figure 11:
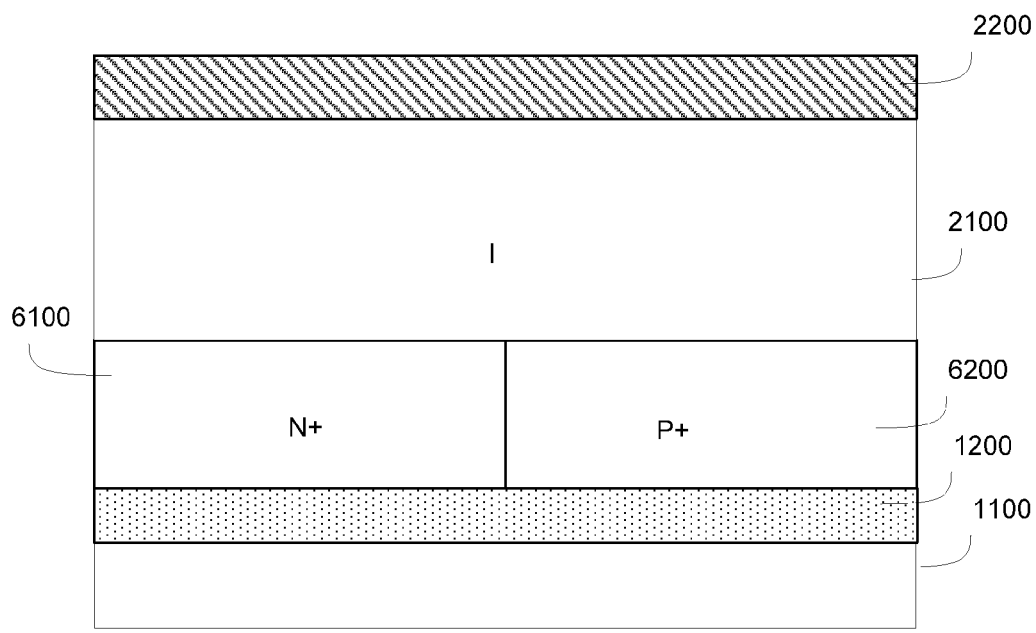
Figure 12:
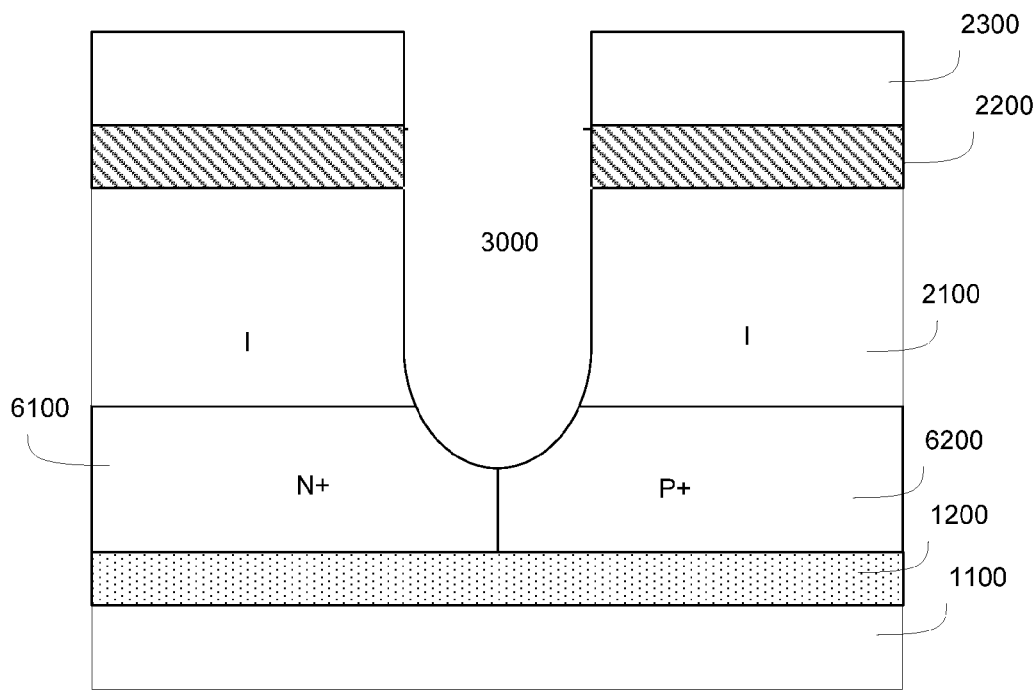

Step S106, a mask layer 2200 and a photoresist layer 2300 are formed on the fourth semiconductor layer 2100, and a part of the fourth semiconductor layer 2100 and a part of the semiconductor layer 6000 are removed using lithography and etching techniques to form a hollow U-shaped concave 3000, as shown in FIGS. 11-12.

Figure 13:
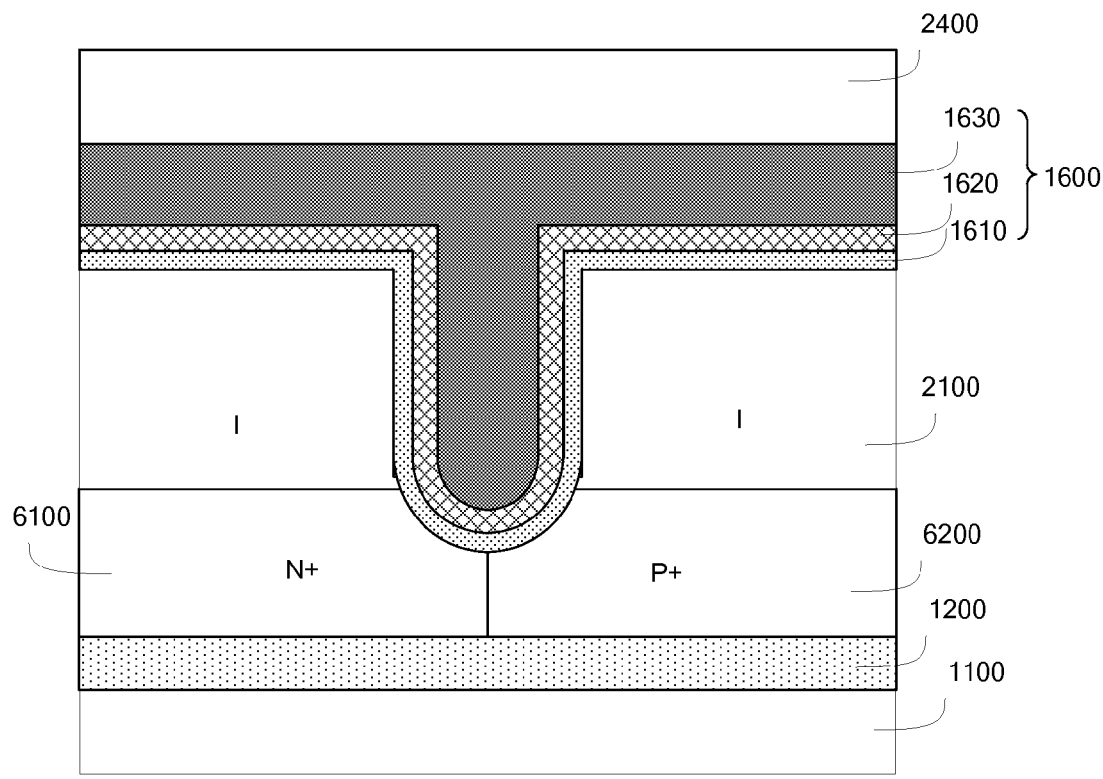
Figure 14:
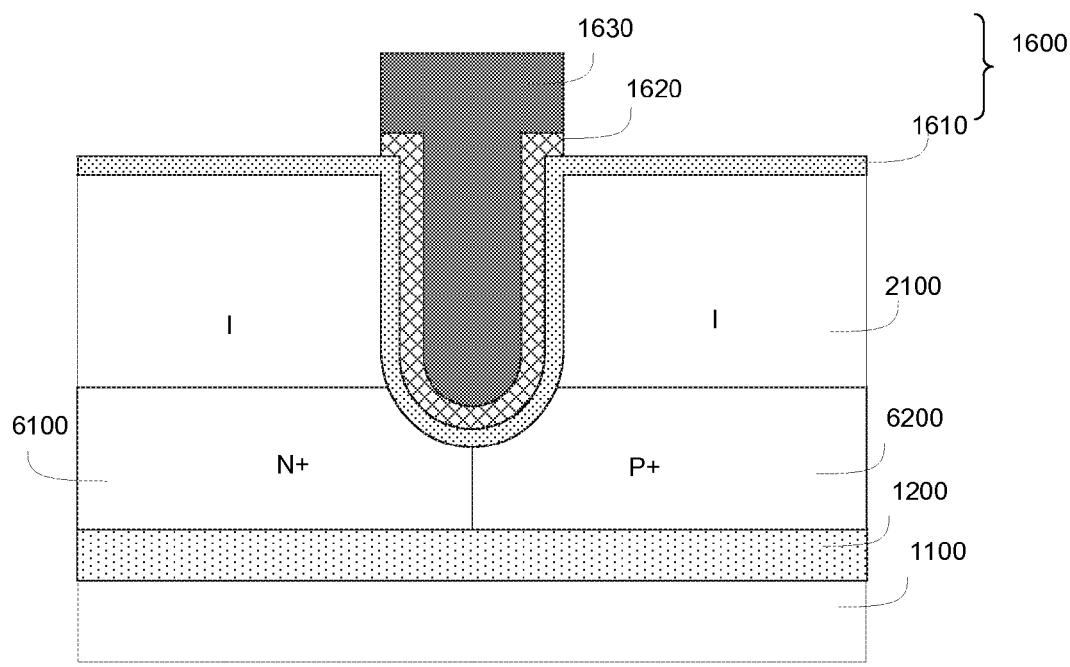

Step S107, a gate dielectric layer 1610, a metal gate electrode layer 1620 and a polysilicon layer 1630 are deposited in the U-shaped concave 3000 respectively; and a photoresist layer 2400 is formed on the polysilicon layer 1630, as shown in FIG. 13. The photoresist layer 2400, a part of the polysilicon layer 1630 and a part of the metal gate electrode layer 1620 are removed using lithography and etching techniques respectively to form a U-shaped gate structure 1600, as shown in FIG. 14.

In the following steps, a first type TFET vertical structure 1400 and a second type TFET vertical structure 1500 are formed on two sides of the U-shaped gate structure 1600 respectively.

Figure 15:
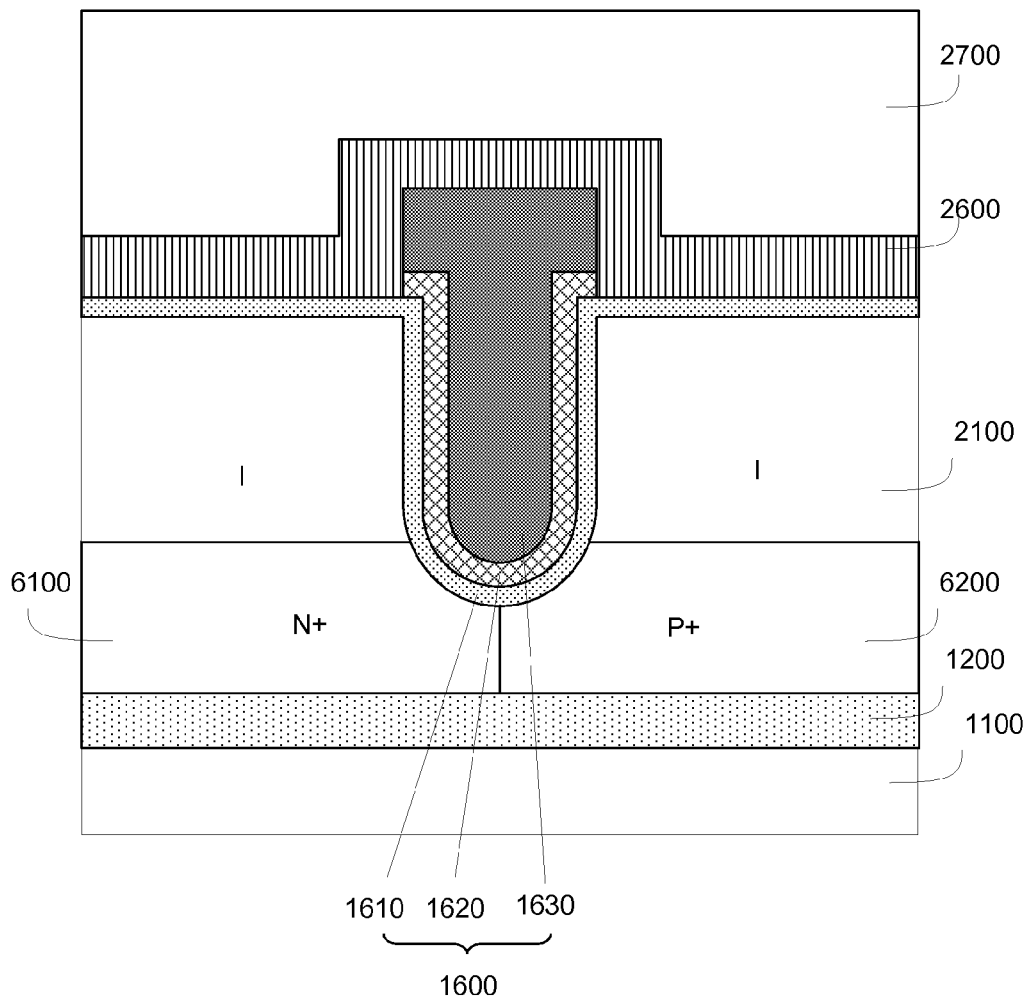

Step S108, a hard mask layer 2600 and a photoresist layer 2700 are deposited on the U-shaped gate structure 1600 respectively, as shown in FIG. 15.

Figure 16:
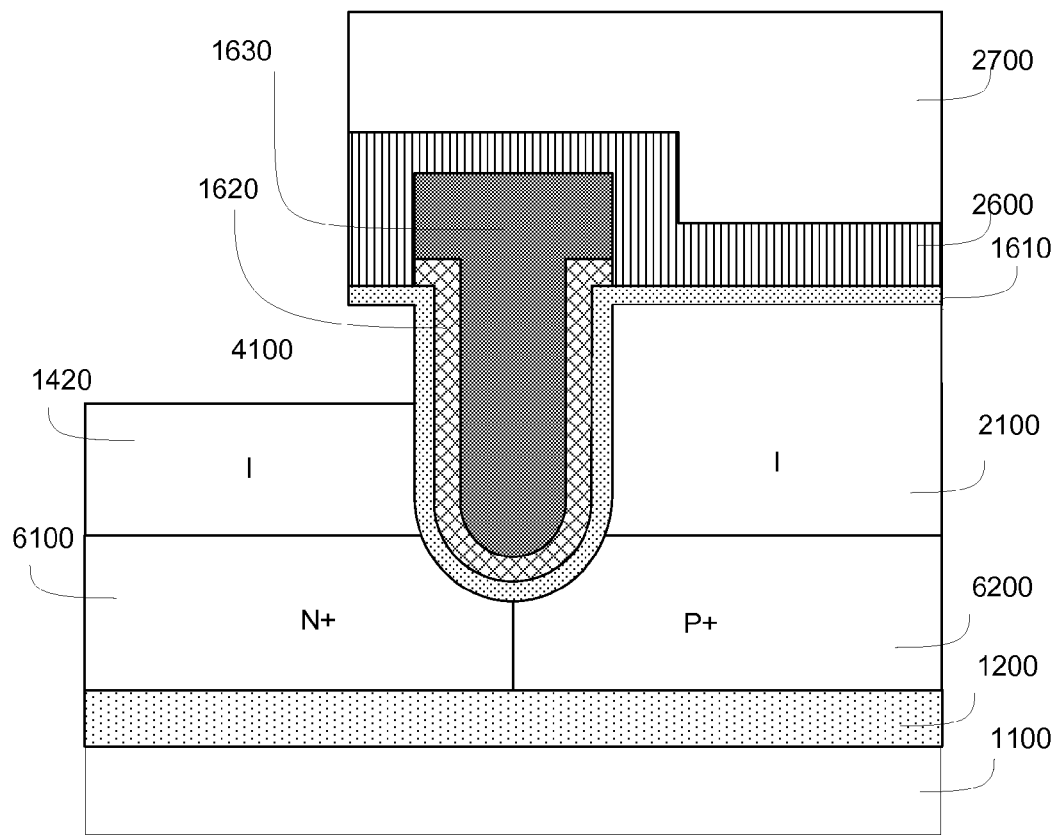

Step S109, using lithography and etching techniques, the source region in the N-type TFET vertical structure 1400 (i.e., the first type TFET vertical structure, a left part in FIG. 16) is etched to form a source region concave 4100, that is, a part of the fourth semiconductor layer 2100 on the first doped region 6100 (N⁺) is etched to form the source region concave 4100, as shown in FIG. 16. A remaining part of the fourth semiconductor layer 2100 on the first doped region 6100 (N⁺) is used as a third semiconductor layer 1420 in the first type TFET vertical structure 1400.

Figure 17:
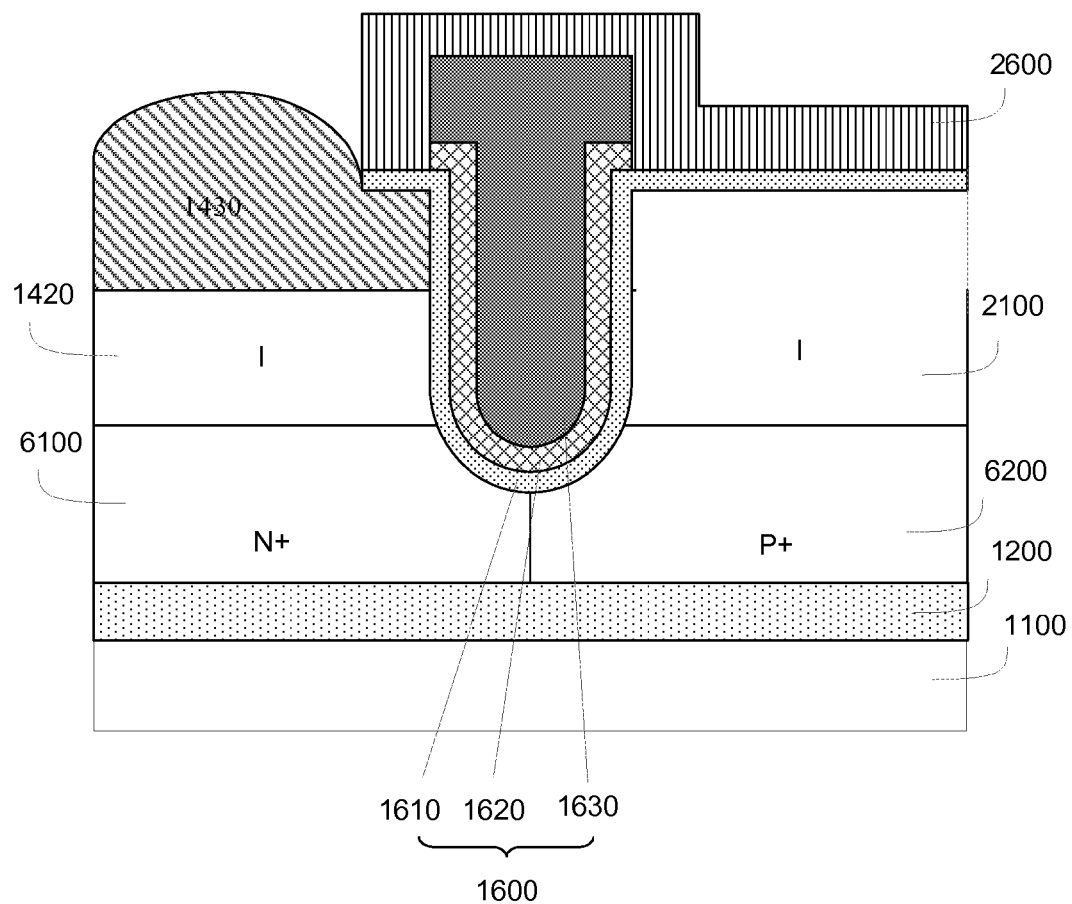

Step S110, the photoresist layer 2700 is removed, and a source region 1430 is formed in the source region concave 4100 by a selective epitaxy, as shown in FIG. 17. In one embodiment, the source region 1430 may be a SiGe region, a Ge region, or a Group III-V compound semiconductor region. The source region 1430 may be heavily in-situ P-type doped during the epitaxy.

Figure 18:
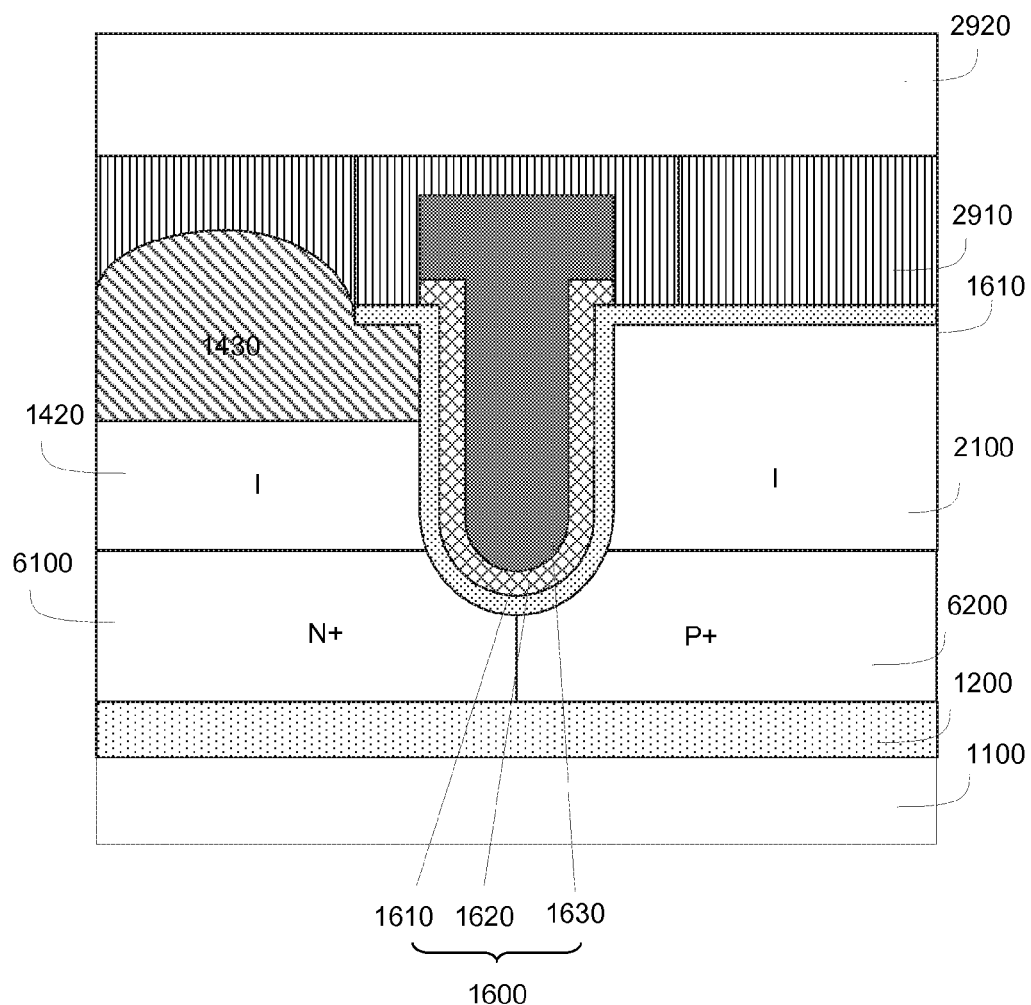

Step S111, a hard mask layer 2910 and a photoresist layer 2920 are formed, as shown in FIG. 18.

Figure 19:
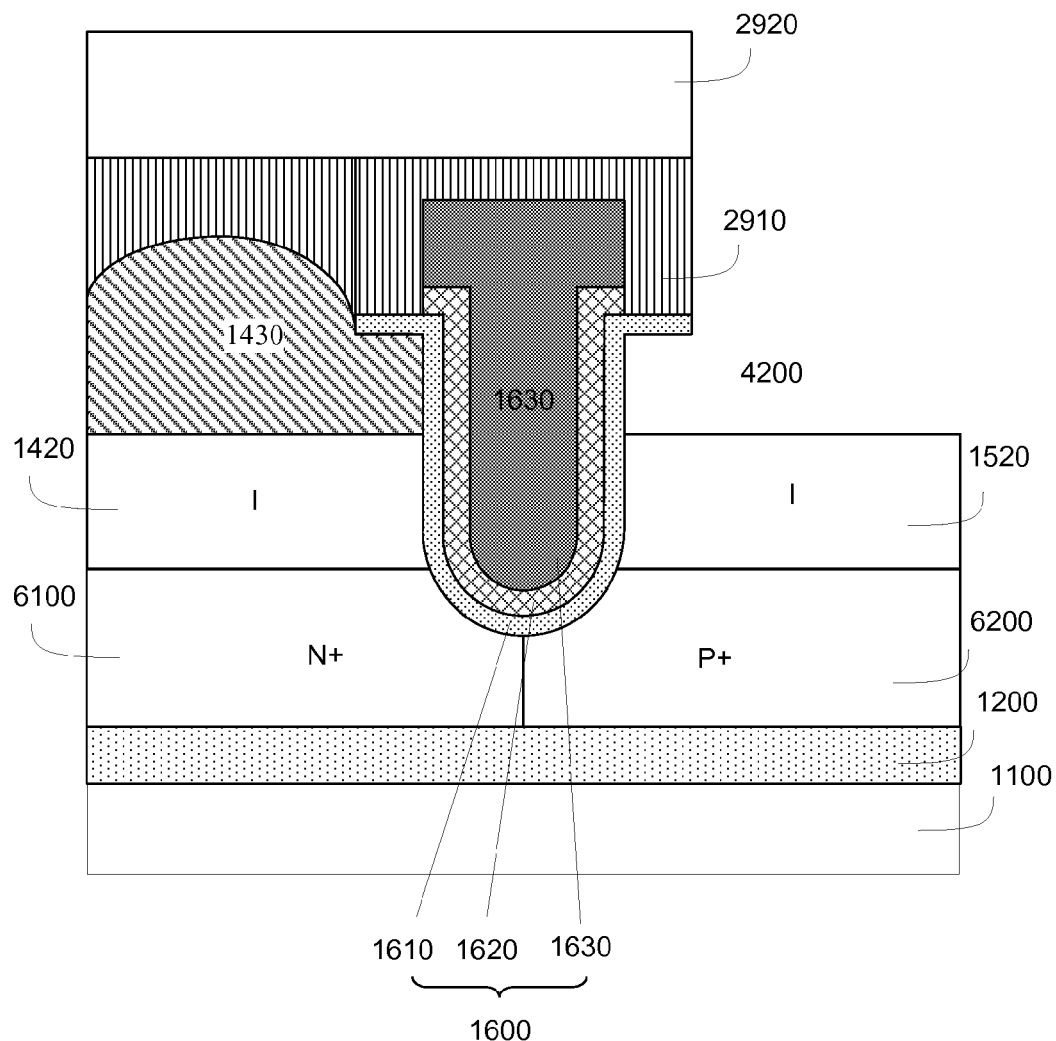

Step S112, using lithography and etching techniques, the source region in the P-type TFET vertical structure 1500 (i.e., the second type TFET vertical structure, a right part in FIG. 19) is etched to form a source region concave 4200, that is, a part of the fourth semiconductor layer 2100 on the second doped region 6200 (P⁺) is etched to form the source region concave 4200, as shown in FIG. 19. A remaining part of the fourth semiconductor layer 2100 on the second doped region 6200 (P⁺) is used as a third semiconductor layer 1520 in the second type TFET vertical structure 1500.

Figure 20:
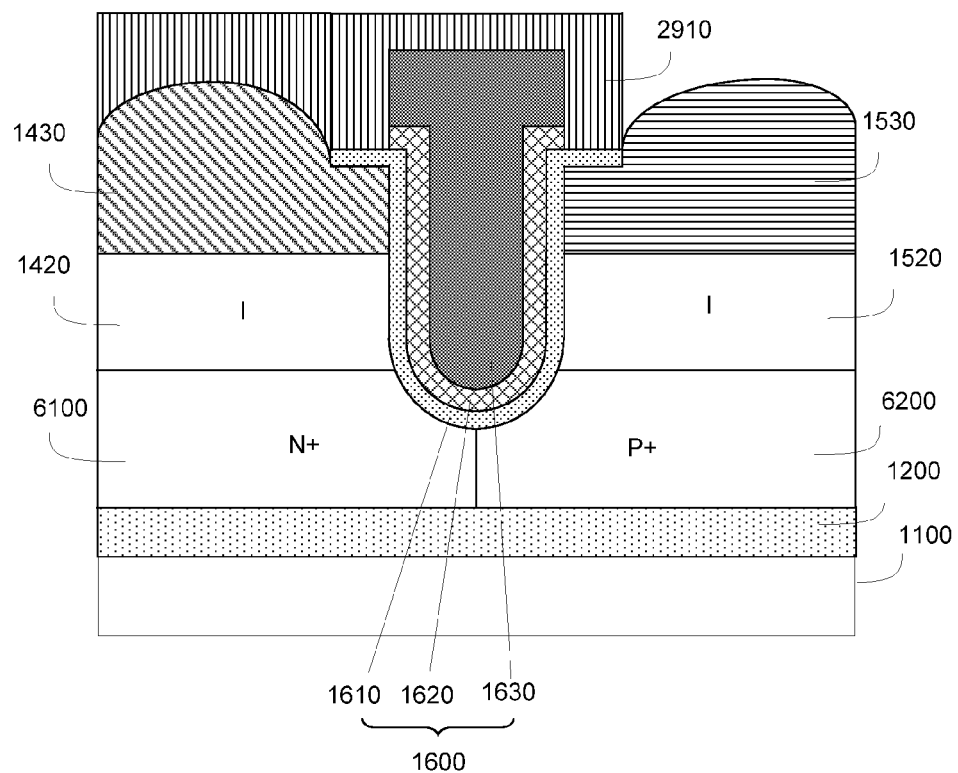

Step S113, the photoresist layer 2920 is removed, and a source region 1530 is formed in the source region concave 4200 by the selective epitaxy, as shown in FIG. 20. In one embodiment, the source region 1530 may be a $Si_{1-x}C_x$ alloy region, in which x ranges from 0.1% to 7.5%. The source region 1530 may be heavily in-situ N-typed doped during the epitaxy.

Figure 21:
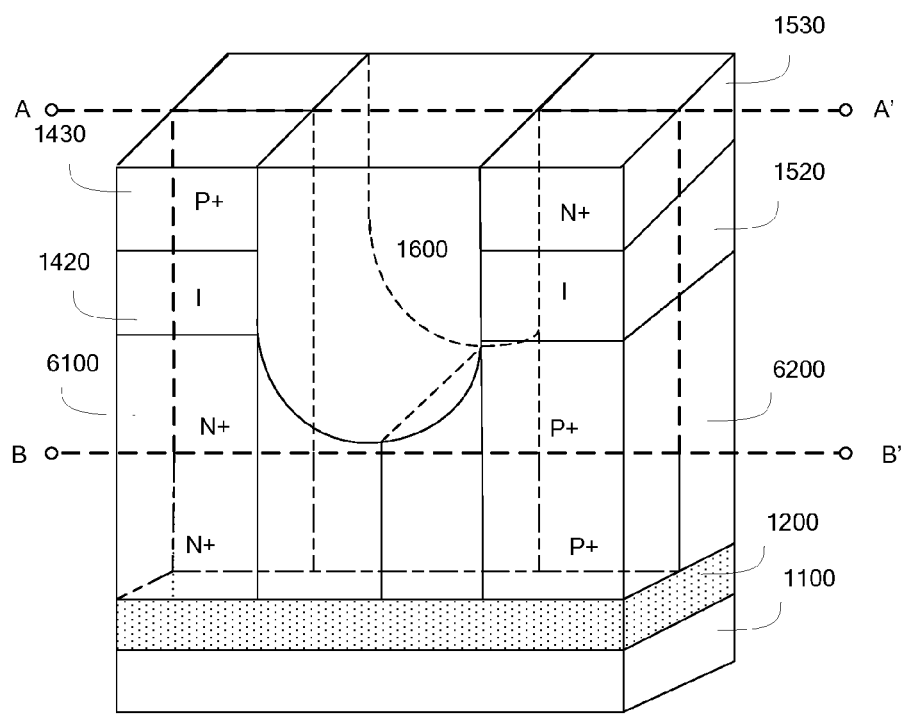
Figure 22:
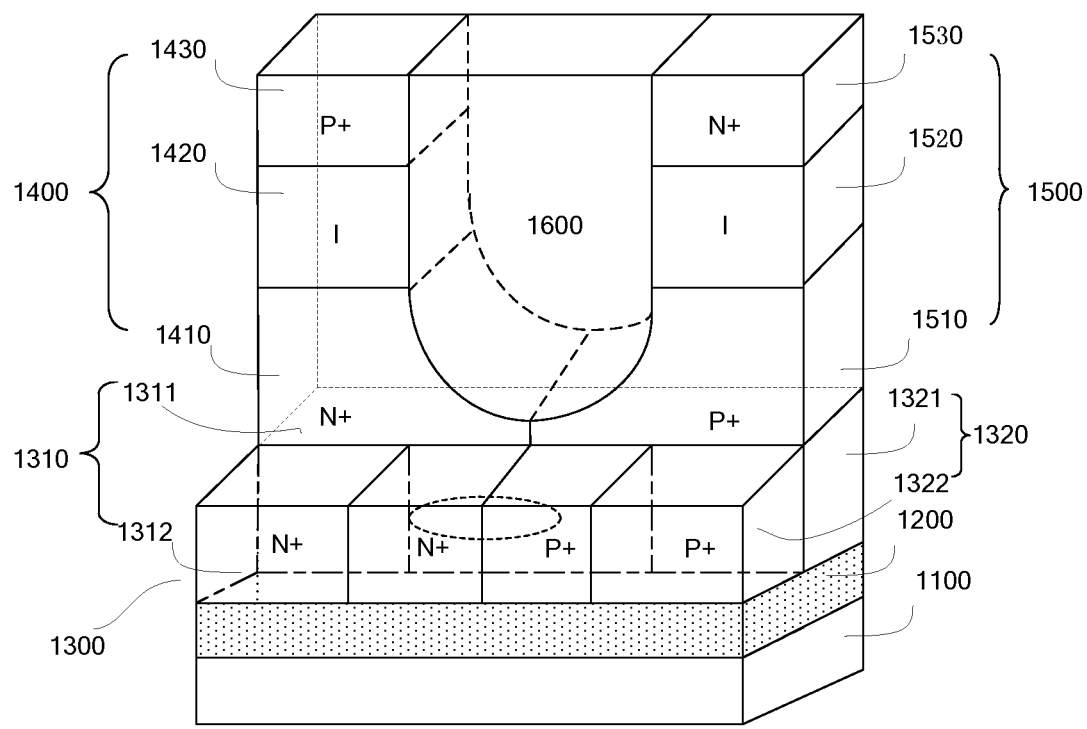

Step S114, using lithography and etching techniques, a part of the first type TFET vertical structure 1400, a part of the U-shaped gate structure 1600 and a part of the second type TFET vertical structure 1500 from AA' to BB' as shown in FIG. 21 are removed to expose a second part 1312 of the first doped region 6100 (N⁺) and a second part 1322 of the second doped region 6200 (P⁺), in which the second part 1312 of the first doped region 6100 and the second part 1322 of the second doped region 6200 are under a bottom of the U-shaped concave, the second part 1312 of the first doped region 6100 is connected with the second part 1322 of the second doped region 6200 and a connecting portion between the second part 1312 of the first doped region 6100 and the second part 1322 of the second doped region 6200 is used as a drain output of the complementary tunneling field effect transistor, as shown in FIG. 22. In one embodiment, after etched, the semiconductor layer 6000 is divided into a first semiconductor layer 1300, a second semiconductor layer 1410 and a second semiconductor layer 1510. After etched, the first doped region 6100 (N⁺) forms an "L"-shaped structure as shown in FIG. 4; and after etched, the second doped region 6200 (P⁺) forms an "L"-shaped structure as shown in FIG. 3.

Figure 23:
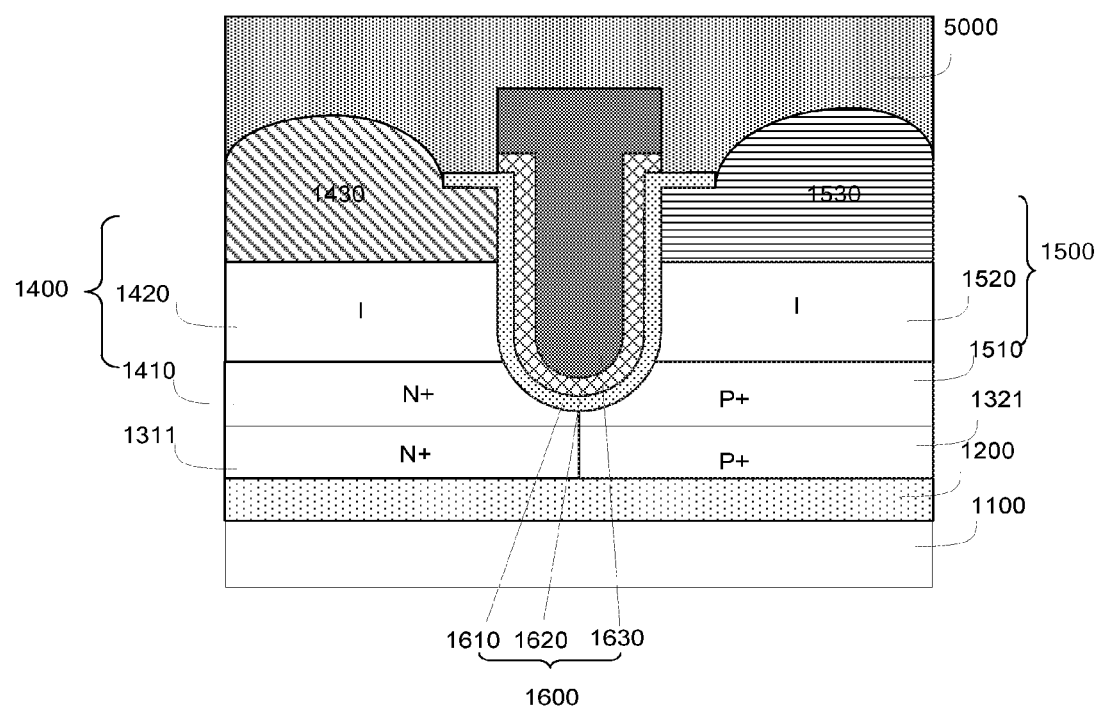

Step S115, the hard mask layer 2910 is removed; an interlayer dielectric layer 5000 is formed on the U-shaped gate structure 1600, the first type TFET vertical structure 1400, the second type TFET vertical structure 1500, the exposed second part 1312 of the first doped region 1310 and the exposed second part 1322 of the second doped region 1320 respectively; and the interlayer dielectric layer 5000 is planarized subsequently, as shown in FIG. 23.

Step S116, the interlayer dielectric layer 5000 is etched; and connecting lines of a gate in the U-shaped gate structure 1600, the source region 1430 in the first type TFET vertical structure 1400 and the source region 1530 in the second type TFET vertical structure 1500, and a connecting line of the drain output 7000 are formed. Cross-sections of the gate input of the U-shaped gate structure 1600, the source region 1430 in the first type TFET vertical structure 1400 and the source region 1530 in the second type TFET vertical structure 1500 are shown in FIG. 7. It should be noted that a contact hole of the drain output is lower than contact holes of the source regions 1430, 1530, and the gate input, and consequently they may be formed independently. When the complementary tunneling field effect transistor works, the source region 1430 in the N-type TFET vertical structure 1400 is grounded; the source region 1530 in the P-type TFET vertical structure 1500 is connected with a power supply; the drain output is used as an output of the N-type TFET vertical structure 1400 and the P-type TFET vertical structure 1500; and a gate in the U-shaped gate structure 1600 is used as a common gate of the N-type TFET vertical structure 1400 and the P-type TFET vertical structure 1500, and the common gate is used as a gate input.

The complementary tunneling field effect transistor has a U-shaped gate structure, the NTFET and the PTFET are formed on two sides of the U-shaped gate structure respectively, and the gate in the U-shaped gate structure is used as the common gate of the N-type TFET vertical structure and the P-type TFET vertical structure, thus significantly improving an integration degree of the transistor and inhibiting a leakage current. Meanwhile, because the source region is of a semiconductor material with a narrow bandgap (relative to a wide bandgap of a semiconductor in a channel region), the source region may be formed by an epitaxy with an in-situ doping or a deposition, so that a concentration gradient of a PN junction formed between the source region and a channel region may be very steep. Therefore, a driving current may be increased, a subthreshold slope may be further reduced, and a power consumption may be reduced. The complementary tunneling field effect transistor with a U-shaped gate structure according to an embodiment of the present disclosure has high integration degree, large driving current, low power consumption, low leakage current, and so on.

Although explanatory embodiments have been shown and described, it would be appreciated by those skilled in the art that changes, alternatives, and modifications all falling into the scope of the claims and their equivalents may be made in the embodiments without departing from spirit and principles of the disclosure.

What is claimed is:

1. A complementary tunneling field effect transistor, comprising:
   a substrate;
   an insulating layer, formed on the substrate;
   a first semiconductor layer, formed on the insulating layer and comprising a first doped region and a second doped region;
   a first type TFET vertical structure formed on a first part of the first doped region and a second type TFET vertical structure formed on a first part of the second doped region, in which a second part of the first doped region is connected with a second part of the second doped region and a connecting portion between the second part of the first doped region and the second part of the second doped region is used as a drain output; and
   a U-shaped gate structure, formed between the first type TFET vertical structure and the second type TFET vertical structure.

2. The complementary tunneling field effect transistor according to claim 1, wherein the first type TFET vertical structure is an N-type TFET vertical structure, the second type TFET vertical structure is a P-type TFET vertical structure, the first doped region is an N-doped region, and the second doped region is a P-doped region.

3. The complementary tunneling field effect transistor according to claim 2, wherein the source region in the N-type TFET vertical structure is a SiGe or Ge region, and the source region in the P-type TFET vertical structure is a $Si_{1-x}C_x$ alloy region, wherein x ranges from 0.1% to 7.5%.

4. The complementary tunneling field effect transistor according to claim 2, wherein the source region in the N-type TFET vertical structure is grounded; the source region in the P-type TFET vertical structure is connected with a power supply; and a gate in the U-shaped gate structure is used as a common gate of the N-type TFET vertical structure and the P-type TFET vertical structure, and the common gate is used as a gate input.

5. The complementary tunneling field effect transistor according to claim 2, wherein the U-shaped gate structure comprises:
   a U-shaped gate dielectric layer;
   a U-shaped metal gate electrode layer formed on the U-shaped gate dielectric layer; and
   a polysilicon layer formed on the U-shaped metal gate electrode layer.

6. The complementary tunneling field effect transistor according to claim 1, wherein
   the first type TFET vertical structure comprises a second semiconductor layer formed on the first part of the first doped region, a third semiconductor layer formed on the second semiconductor layer, and a source region formed on the third semiconductor layer; and
   the second type TFET vertical structure comprises a second semiconductor layer formed on the first part of the second doped region, a third semiconductor layer formed on the second semiconductor layer, and a source region formed on the third semiconductor layer.

7. The complementary tunneling field effect transistor according to claim 6, wherein each of the first semiconductor layer, the second semiconductor layer on the first part of the first doped region and the second semiconductor layer on the first part of the second doped region is a Si layer, a SiGe layer or a Ge layer.

8. The complementary tunneling field effect transistor according to claim 6, wherein each of the first doped region and the second semiconductor layer on the first part of the first doped region is an N-doped region, and the second semiconductor layer on the first part of the second doped region is a P-doped region.

9. A method for forming a complementary tunneling field effect transistor, comprising steps of:
   providing a substrate;
   forming an insulating layer on the substrate;
   forming a semiconductor layer on the insulating layer and doping the semiconductor layer to form a first doped region and a second doped region;
   forming a third semiconductor layer on the semiconductor layer;
   etching a part of the third semiconductor layer and a part of the semiconductor layer to form a hollow U-shaped concave;
   forming a U-shaped gate structure in the U-shaped concave;
   forming a first type TFET vertical structure and a second type TFET vertical structure on two sides of the U-shaped gate structure respectively;
   etching the semiconductor layer to expose a second part of the first doped region and a second part of the second doped region, in which the second part of the first doped region and the second part of the second doped region are under a bottom of the U-shaped concave, the second part of the first doped region is connected with the second part of the second doped region and a connecting portion between the second part of the first doped region and the second part of the second doped region is used as a drain output of the complementary tunneling field effect transistor.

10. The method according to claim 9, wherein the first type TFET vertical structure is an N-type TFET vertical structure, the second type TFET vertical structure is a P-type TFET vertical structure, the first doped region is an N-doped region, and the second doped region is a P-doped region.

11. The method according to claim 10, wherein forming the source region in the N-type TFET vertical structure comprises:
   etching the source region in the N-type TFET vertical structure to form a source region concave; and
   forming a SiGe or Ge source region in the source region concave.

12. The method according to claim 10, wherein forming the source region in P-type TFET vertical structure comprises:
   etching the source region in the P-type TFET vertical structure to form a source region concave; and
   forming a $Si_{1-x}-C_x$ alloy source region in the source region concave, wherein x ranges from 0.1% to 7.5%.

13. The method according to claim 10, further comprising:
   forming an interlayer dielectric layer on the U-shaped gate structure, the first type TFET vertical structure, the second type TFET vertical structure, the exposed second part of the first doped region and the exposed second part of the second doped region respectively; and
   etching the interlayer dielectric layer and forming connecting lines of the U-shaped gate structure, the source region in the first type TFET vertical structure and the source region in the second type TFET vertical structure, and a connecting line of the drain output.

14. The method according to claim 13, wherein the source region in the N-type TFET vertical structure is grounded; the source region in the P-type TFET vertical structure is connected with a power supply; and a gate in the U-shaped gate structure is used as a common gate of the N-type TFET vertical structure and the P-type TFET vertical structure, and the common gate is used as a gate input.

15. The method according to claim 10, wherein the U-shaped gate structure comprises:
   a U-shaped gate dielectric layer;
   a U-shaped metal gate electrode layer formed on the U-shaped gate dielectric layer; and
   a polysilicon layer formed on the U-shaped metal gate electrode layer.

16. The method according to claim 9, wherein etching the semiconductor layer comprises dividing the semiconductor layer into a first semiconductor layer, a second semiconductor layer on the first doped region, and a second semiconductor layer on the second doped region.

17. The method according to claim 16, wherein the first type TFET vertical structure comprises a second semiconductor layer formed on a first part of the first doped region, a third semiconductor layer formed on the second semiconductor layer, and a source region formed on the third semiconductor layer; and
   the second type TFET vertical structure comprises a second semiconductor layer formed on a first part of the second doped region, a third semiconductor layer formed on the second semiconductor layer, and a source region formed on the third semiconductor layer.

18. The method according to claim 9, wherein the first doped region is an N-doped region, and the second doped region is a P-doped region.

* * * * *